(12) United States Patent
Koduri et al.

(10) Patent No.: US 6,629,013 B2
(45) Date of Patent: Sep. 30, 2003

(54) SYSTEM AND METHOD TO REDUCE BOND PROGRAM ERRORS OF INTEGRATED CIRCUIT BONDERS

(75) Inventors: Sreenivasan K. Koduri, Plano, TX (US); David J. Bon, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 255 days.

(21) Appl. No.: 09/847,905

(22) Filed: May 3, 2001

(65) Prior Publication Data

US 2001/0044669 A1 Nov. 22, 2001

Related U.S. Application Data

(60) Provisional application No. 60/201,910, filed on May 4, 2000.

(51) Int. Cl.⁷ .......................... G05B 19/18; G06F 19/00; B23K 31/00; B23K 31/02
(52) U.S. Cl. .......................... 700/121; 700/59; 700/114; 228/180.5
(58) Field of Search .......................... 700/59, 114, 121; 228/105, 4.5, 180.5; 382/145, 151

(56) References Cited

U.S. PATENT DOCUMENTS

| | | | | |
|---|---|---|---|---|
| 5,516,023 A | * | 5/1996 | Kono | 228/4.5 |
| 5,579,984 A | * | 12/1996 | Sasano | 228/102 |
| 5,862,974 A | * | 1/1999 | Sasano | 228/4.5 |

* cited by examiner

Primary Examiner—Leo Picard
Assistant Examiner—Ryan A Jarrett
(74) Attorney, Agent, or Firm—Michael K. Skrehot; Wade James Brady, III; Frederick J. Telecky, Jr.

(57) ABSTRACT

A computerized system and method for reducing bond program errors in a slave bonder, prepared to attach connecting bonds onto bond pads of a slave integrated circuit, by first collecting, on a master bonder, input data concerning bond x-y locations, alignment reference x-y locations, and alignment reference images from a master integrated circuit, then analyzing these data to construct a network of relationships between reference images and bond locations, and store data and relationships in a master file. Secondly, on a slave bonder, all this information is automatically retrieved and compared by a computer with input data concerning alignment reference images from a slave circuit. Thirdly, any discrepancy found is corrected by a computer to identify the new bond locations on the slave circuit. Finally, the slave bonder attaches the connecting bonds based on the computed correct bond locations.

22 Claims, 5 Drawing Sheets

SYSTEM AND METHOD TO REDUCE BOND PROGRAM ERRORS OF INTEGRATED CIRCUIT BONDERS

This application claims the benefit of Provisional Application No. 60/201,910, filed May 4, 2000.

FIELD OF THE INVENTION

The present invention is related in general to the field of semiconductor devices and electronic systems and more specifically to reduced-error set-ups and operation of computer-controlled bonding machines used in integrated circuit assembly.

DESCRIPTION OF THE RELATED ART

In integrated circuit (IC) assembly, an IC chip is typically mounted on a leadframe and electrically connected to it by metallic segments. Commonly, the chip assembly is encapsulated in a protective package (for instance, ceramic package, or plastic package using molding process). Typically, the IC chip has a plurality of bond pads, which are often positioned around the chip perimeter; these bond pads have predetermined bonding area and spacing (bond pad pitch). The leadframe usually has a plurality of narrow "inner" leads for attachment to the segments and inclusion in the package, and a plurality of wider "outer" leads for attachment to other parts such as solder attachment to circuit boards.

The metallic segments used for electrical connection of the IC chip to the leadframe include wires and ribbons, and are attached by ball bonding, stitch bonding, or wedge bonding techniques. Wire bonding is a process in which a wire may be welded from a chip bond pad to the tip of an inner lead of the leadframe. As an example, in wire ball bonding the ball is attached to the chip bond pad and the stitch to the leadframe inner lead. For a given device type, there is a set of locations expressed in x and y coordinates which defines the bond locations on the chip and on the lead tips. These locations are generally stored collectively in a computer file, sometimes referred to as "Device Program". Apart from the bond head, capable of providing x-y-z motion needed for bonding, a wire bonder has a material handling subsystem and the vision subsystem.

Conventional semiconductor computerized wire bonders use x-y tables to move the bonding capillary over the device for bonding between the chip and the leadframe. The x-y coordinate tables are driven by complex electrical and mechanical components that may convert rotary and linear motions of the axis drive motors to create the needed positioning. The bond head also carries several other components such as the z-axis drive motor, a camera and optics for vision functions, and further components required to control wire bonding. Specific features of the capillary and its alignment are described in a number of U.S. patents and patent applications. Examples are: U.S. Pat. No. 5,934,543, issued on Aug. 10, 1999 (Koduri et al., "Wire Bonding Capillary having Alignment Features"); and application Ser. No. 08/993,638, filed on Dec. 18, 1997 (Koduri, "Wire Bonding with Capillary Realignment"). The interaction of capillary and vision system is illustrated, for example, by U.S. patent application Ser. No. 09/191,812, filed on Nov. 13, 1998 (Koduri et al., "Automation of Optics Offset Measurement on Wire Bonders"); Ser. No. 09/111,642, filed on Jul. 8, 1998 (Koduri et al., "An Efficient Hybrid Illuminator"); Ser. No. 09/111,977, filed on Jul. 8, 1998 (Koduri et al., "An Efficient Illumination System for Wire Bonders").

The material handling system moves a leadframe so that each device can eventually be placed under the bond head for bonding. One or more devices may be placed under the bond head at a time to be bonded. The device may also be heated in a predetermined manner to establish reliable metallurgical bonding conditions. After a device has been bonded, the leadframe is step-moved such that the next unit can be bonded.

When a unit is indexed in by the material handling system for bonding, the position of the leadframe and the chip is not always the same because of variations in the handling and previous manufacturing (such as variable chip positioning during attachment to the leadframe). Without knowing accurately the target bonding locations, the bond head cannot place the bonds as expected. To aid this process, a machine vision system is employed. A typical vision system consists of a set of optics to provide the needed illumination and magnification of the device, a camera to capture the image provided by the optics and an image processing system to store and analyze the captured image.

Before bonding a device, it is essential to determine the device program with all the coordinate locations of the bonds that need to be created. With respect to a predetermined set of reference locations, those locations are often referred to as "homes". A typical device may have one or more "homes". Generally, the identification of homes needs to be done individually for each device to be bonded. It is common practice to use a three-step process to enable such identification.

In the step of "teaching", the coordinate locations of the homes and all the needed bonds are identified and saved to create the "device program". Once generated, a device program can be stored, copied and/or shared between multiple machines as needed.

In the step of "regeneration", a human operator helps in locating the homes of the first device after loading in the information from the previously saved device program. At this point, the machine captures and saves a set of images, called "reference images" or "references" in the neighborhood of each home.

In the step of "bonding", the machine indexes one unit or more at a time into the workstation under the bond head. At this point, the vision system, with the aid of a pattern recognition system, attempts to relocate the matching locations with the saved references. After finding the new coordinates of the matching references, the home and bond locations are re-computed for that specific unit from the device program data. The process of relocating the references and homes is normally referred to as "aligning" the device. Using the specific bond locations, the device can now be bonded. The process of indexing, aligning and bonding is repeated without any human intervention as long as nothing abnormal happens on the machine.

A typical alignment procedure may correct for a constant shift in x-y directions and/or a constant rotation of the device. In this context, it is important to understand the effects of variations in illumination settings across machines and the images formed using different levels of brightness. Large differences in intensity settings can reduce the ability of the pattern recognition system to locate the references accurately. It is very much desired to have a consistent level of brightness and image quality across all the machines used.

Problems in wire bonding techniques arise in part from the technology trends to increase the number of leads in a given package and to make IC chip packages smaller. As consequences, the bonding pads located on the chip receive smaller areas and are spaced closer together, and the inner leads of leadframes are made narrower and closer together. These trends demand tighter control of wire bond ball and stitch geometries and placements. For instance, even small bond placement errors may result in device loss.

For the bond machines, errors in x-y tables and motors need to be reduced. At the microscopic level, each axis of each table behaves differently with its own local variations within their usable regime. For instance, an axis might have a 0.5% error in its first half of working distance and a 0.8% error in its second half. Further, a x-y pair might have a global positioning error because of an error in the orthogonality between them; or the tables may exhibit a range of hysteresis errors. These variations become even more threatening as common device programs are shared due to quality enforcement and economic reasons.

The emerging technical problems for automated bond machines can be summarized as follows:

Accuracy: Small ball/fine pitch bonding requires a very accurate system to be able to place the ball completely on the bond pad. The current systems have difficulties in achieving this.

Large variations in illumination settings can lead to variations of the images as seen by the optics and the camera. These variations may affect the ability of the pattern recognition system in locating the homes and bond locations accurately.

The current systems cannot handle x-y table inconsistencies. For small pad/fine pitch bonding, a small error in ball placement can cause the ball to be partially off the pad.

Human error during regeneration of alignment program: Ball placement is greatly affected by the accuracy of the alignment program. There are many steps to this regeneration process and thus there are many chances for human error.

Time spent performing alignment regeneration: Whenever a device is to be bonded, a human operator typically has to spend a finite amount of time to perform an alignment regeneration.

An urgent need has therefore arisen for a fast, reliable and flexible system and method to reduce set-up time, reduce errors during creation and retrieval of bonding programs, compensate for machine variability, and standardize illumination conditions on bonding machines. The system and method should be flexible enough to be applied for different IC product families with a wide spectrum of design variations, and for different bond machines. The system and method should spearhead solutions toward the goals of improved product yield and reliability, preferably without investment in new equipment.

SUMMARY OF THE INVENTION

The present invention provides a computerized system and method for reducing bond program errors in a slave bonder, prepared to attach connecting bonds onto bond pads of a slave integrated circuit, by first collecting, on a master bonder, input data concerning bond x-y locations, alignment reference x-y locations, and alignment reference images from a master integrated circuit, then analyzing these data to construct a network of relationships between reference images and bond locations, and store data and relationships in a master file. Secondly, on a slave bonder, all this information is automatically retrieved and compared by a computer with input data concerning alignment reference images from a slave circuit. Thirdly, any discrepancy found is corrected by a computer to identify the new bond locations on the slave circuit. Finally, the slave bonder attaches the connecting bonds based on the computed correct bond locations.

The present invention is related to high density ICs, especially those having high numbers of input/outputs and tight constraints in package outline and profile. These ICs can be found in many semiconductor device families such as processors, standard linear and logic products, digital and analog devices, high frequency and high power devices, and both large and small area chip categories. Since the invention aims at designing devices with minimum geometries and high reliability, it supports continually shrinking applications such as cellular communications, pagers, hard disk drives, laptop computers and medical instrumentation.

It is an object of the present invention to provide an automated system and method for retrieving master information and comparing it with the actual bond pad locations on the circuit-to-be-bonded, followed by automated corrections, while entering the master input data manually by an expert. Constructing the network of relationships between the entered data is also computerized. The object is achieved by an embodiment of the invention using a computer system and a computer-implemented method for automatically collecting, analyzing and storing the needed information.

Another object of the present invention is to provide a highly flexible system and method. This object is achieved by the embodiments of four subsystems of the invention:

A user-friendly manual input data generator operable to select alignment reference points, reference images, and bond pad points from a master circuit belonging to the same device family as the circuit-to-be-bonded ("slave circuit").

A computerized analysis generator operable to establish geometric relationships, expressed in x-y and polar coordinates, between the master circuit bond pads and reference structures, and to store all data and relationships in a master file.

A computerized retriever operable to download these data and relationships to a slave bonder designated to perform the bonding processes on the slave circuit.

A comparative corrector operable to compare alignment reference images from the master file to reference image inputs generated from the slave circuit, and then to correct any shift, rotations or scalings between these two images or image parts. After the computational bond pad corrections, the slave bonder is ready to perform the bonding processes on the re-computed pads of the slave circuit.

Another object of the present invention is to provide the newly computed bond locations in fast turn-around time and with minimum effort by taking full advantage of symmetries and branching in the computational flows of the input and analysis generators, the retriever, and the corrector.

Another object of the present invention is to introduce bond program teaching, loading ("regeneration") and correcting concepts which are flexible so that they can be applied to many families of electronic structures—reaching from piece parts, such as leadframes and interconnectors, to device packages, to electronic substrates, and to whole assemblies on motherboards—and are general so that they can be applied to several generations of products. Beyond the electronics realm, the computerized system and method of this invention can be generally applied to reduce operational program errors on slave machines prepared to work on action sites of slave objects, when a master machine and a master object, having a structure similar to the slave object, are available.

The technical advances represented by the invention, as well as the objects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
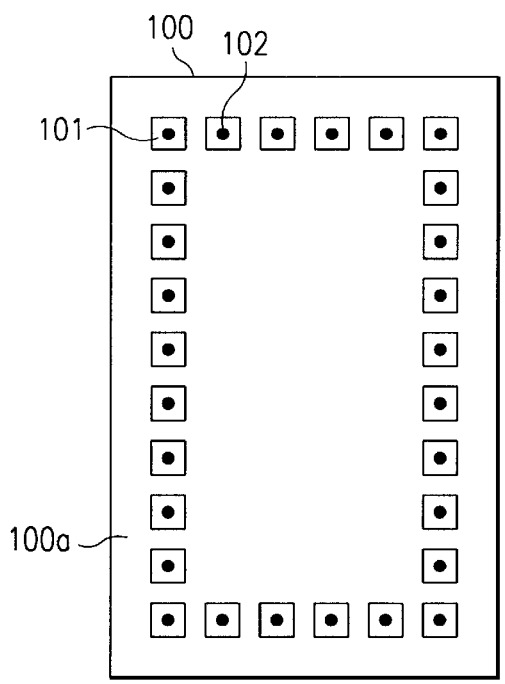
FIG. 1 is a schematic and simplified top view of an integrated circuit (IC) chip illustrating bond pads with correctly placed bond attachments.
Figure 2:
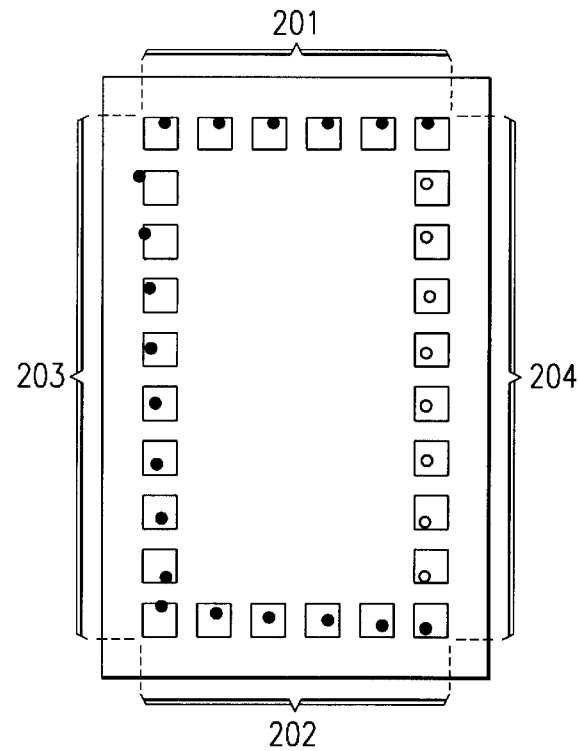
FIG. 2 is a schematic and simplified top view of an IC chip illustrating bond pads with erroneously placed bond attachments.

FIGS. 1 and 2 illustrate examples of the problems in semiconductor chip assembly and the errors in bonding operation addressed by the present invention. In FIG. 1, a plurality of bond pads 101 is provided on the active surface 100a of chip 100. In the ideal assembly case illustrated, all bonds 102 attached to pads 101 are located in the center of the pad areas. In FIG. 2, a similar plurality of bond pads is shown, but the bonds are located off the ideal locations in several ways. In the top row 201 of pads, all bonds are offset and shifted towards the pad perimeter (where probably all of them will represent a risk to the quality of the bonds and to the reliability of the material surrounding the pad area). In the bottom row 202 of pads, the bonds are gradually slanted (so that several of them fall outside of the range of acceptable bond). In the left hand row 203 of pads, the bonds are also gradually slanted (so much so that some bonds miss their pads altogether). In the right hand row 204 of pads, the bond are spread out and misplaced without a general trend (possibly caused by non-linearities in the axis of the row or by gradual thermal expansion of the chip).

Any of the errors depicted in FIG. 2 can severely limit the ability of bonding machines ("bonders") and thus the ability of producing smaller, faster ands lower cost devices economically. The solutions to these errors of known technology include building and testing the x-y tables for higher perfection—which is prohibitively expensive and often not acceptable to the existing fleet of machines. In contrast, the present invention avoids these errors by the system depicted in FIG. 3.

Figure 3:
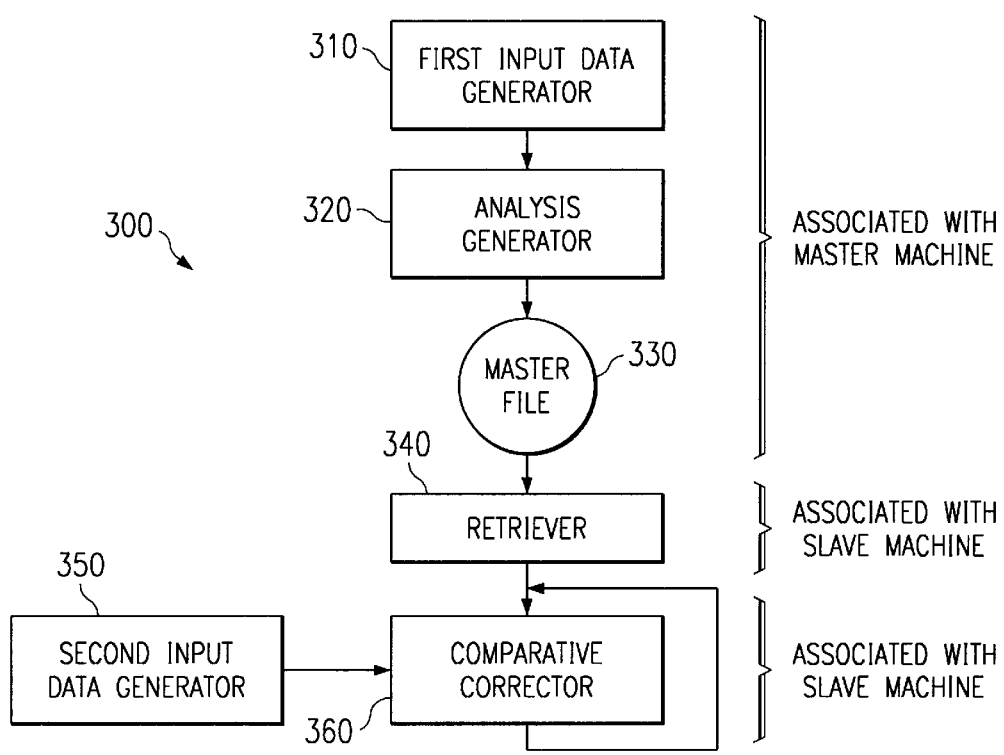
FIG. 3 illustrates a block diagram of a computer system for reducing bond program errors of a semiconductor chip assembly bonder according to the invention.

In order to highlight the conceptual breadth of the present invention, as summarized in the block diagram of FIG. 3, it should be pointed out that the contributing innovations come from three regimes of the assembly and bonding process:

Establishing the Master Bond Program ("Teaching")
   Defining bond locations (x-y parameters).
   Defining a set of alignment reference images.
   Relating the bond locations and alignment reference images in a network of relationships.
   Saving data and relationships in a master bond program.
Regenerating (Loading) Master Bond Program
   Retrieving the saved master program onto a slave bonder.
Bonding the Slave Circuit using Unit-Specific Corrections
   Identifying/quantifying any shifts, rotations, or Scalings between the saved master program and the Circuit-to-be-bonded (slave circuit).
   Re-computing the bond locations to match the slave circuit.
   Bonding using the newly computed bond locations.

The above list shows that the invention uses automation in order to solve the problem in standard technology that a human operator has to be involved to correct the peculiar problems posed by the bonding to a circuit with irregularities. In principle, the innovation is based on relationships expressed between geometrical x-y locations and images of bond pads and reference structures.

The description of the invention based on FIG. 3 and the more detailed FIGS. 4 to 10 will illustrate that the invention is not restricted to ICs, bonders and bonding technology, but can be generalized to similar tasks in which a process is to be performed on objects with imperfections or deviations relative to a selected master object.

As illustrated schematically in the simplified block diagram of FIG. 3, the computerized system of the present invention, generally designated 300, operates to provide data generation as well as data analysis for creating corrected bonding instructions for the bonding process of an IC. A first data input generator 310 is associated with a master bonding machine ("bonder") and collects data manually by a human expert. Included in these data are geometrical information such as x-y locations-of bond pads, x-y locations of alignment references, and images of these alignment references. All data is collected from a master IC which is related in geometry to the circuit-to-be-bonded, usually an IC of the same device type.

Input data generator 310 is connected to an analysis generator 320, also associated with the master bonder and operated manually by a human expert. The analysis generator establishes relationships for the master bonder between the images of the alignment references and the geometrical information of the bond pads. It further constructs a network of these relationships. The analysis generator 320 then stores the network of relationships together with the geometrical information of the bond pads and the images of the alignment references in the master file 330. These stored data is referred to as the master bond program. It is coupled to the master bonder, but also to any selected bonder working as slave bonder.

Associated with the slave bonder is a retriever 340, operated by computer or, alternatively, manually by the user of the slave bonder. The retriever 340 is coupled to master file 330 and has the job of retrieving any and all information stored in master file 330 for the benefit of the slave bonder.

Further associated with the slave bonder is the second input data generator 350 which collects images from alignment references on the circuit-to-be-bonded and makes them available in conjunction with the data retrieved by retriever 340.

Further associated with the slave bonder is the comparative corrector 360 which is coupled both to the retriever 340 and the second input data generator 350. Comparative corrector 360 compares the master bond program with the slave circuit alignment references and corrects any deviation found between the references and the program. The bond pad locations on the slave circuit and the whole bond program of the slave bonder are re-computed. Directed by the re-computed bond program, the computerized slave bonder is enabled to attach the connecting bonds to the slave circuit bond pads to the correct bond pad locations, free of errors and manual operator interference.

The computerized system 300 is generally capable of eliminating errors during creation and retrieval of an operational program in a slave machine which is prepared to work on action sites of a slave object. Examples are programs of machines which function to deposit materials onto object surfaces (for instance, by printing, inking or jetting), or which are to perform operations in a patterned arrangement (for instance, drilling of holes). The principals of this invention apply to these examples.

Figure 4:
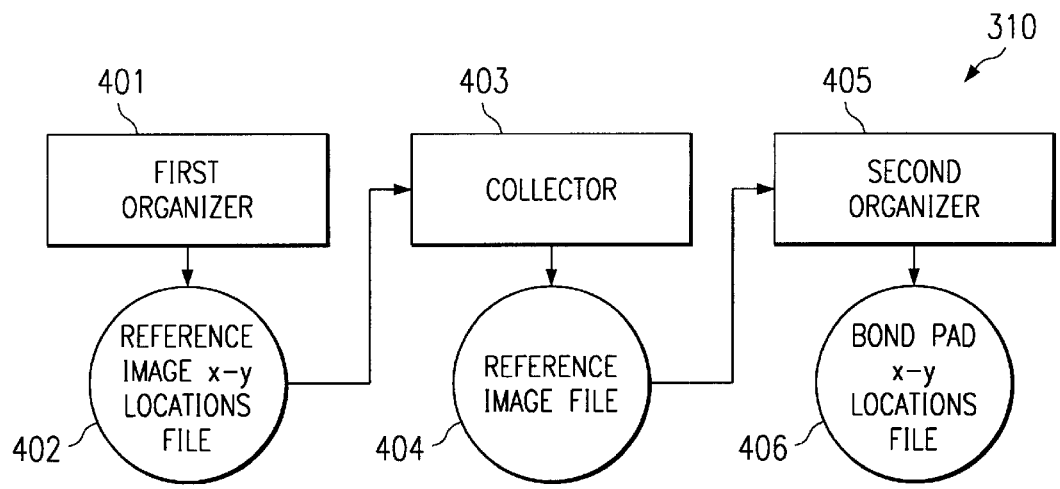
FIG. 4 illustrates a block diagram of the detail of the input data generator associated with the computerized master bonder.

FIG. 4 shows the input data generator 310 in more detail. The first organizer 401 operates to select geometrical points of images of alignment reference structures. This "teaching" of the reference points can be performed manually. The organizer then collects the x-y locations describing the position and the size of the reference images, and stores these x-y locations data in file 402. Consequently, file 402 serves to save the reference image x-y locations.

File 402, and thus the first organizer 401, is coupled to collector 403. This collector operates to collect the images proper of said alignment references and store these images in the reference image file 404. This image collection can be performed manually.

File 404, and thus collector 403, is coupled to the second organizer 405. This second organizer 405 operates to select bond pads, to collect x-y locations describing the position and the size of the pads, and to store these x-y locations data in file 406. Consequently, file 406 serves to save bond pad point x-y locations. This "teaching" of the bond points can be performed manually.

Figure 5:
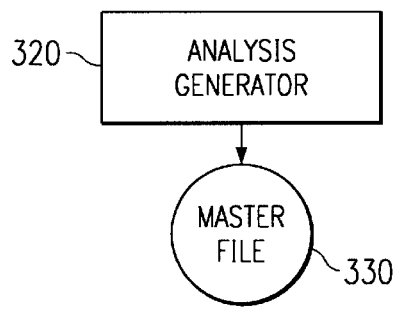
FIG. 5 illustrates a block diagram of the detail of the analysis generator and the master file associated with the computerized master bonder.

FIG. 5 shows the function of the analysis generator in more detail. The analysis generator 320 is a computerized relations builder. In its operation it first selects x-y locations of the bond pads; it then expresses their mutual geometries and their relationships to the alignment reference images. These relations comprise equations in x-y coordinates and polar coordinates. As a result, an interconnected network of relationships between bond pad points and reference images of the master circuit is established.

This interconnected network is stored in master file 330. Further, master file contains all the geometrical data and the images of the bond pads as well as the alignment references.

Figure 6:
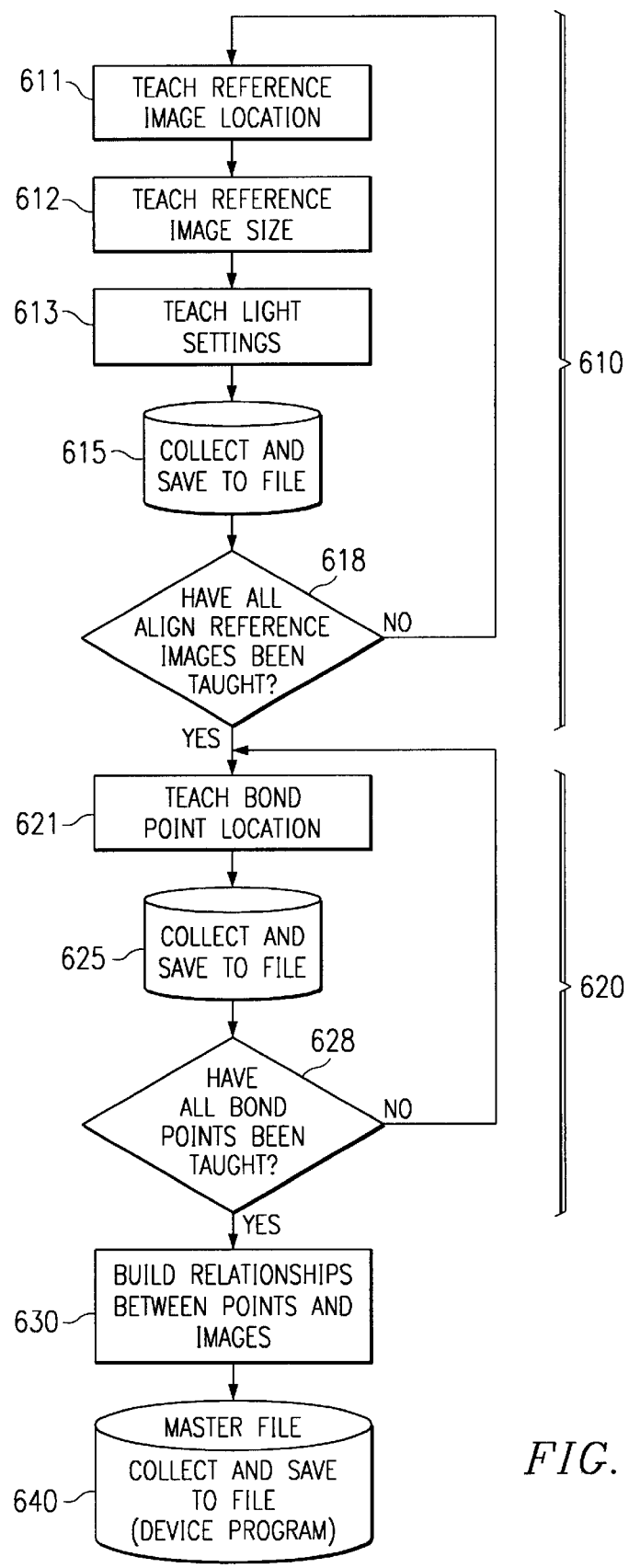
FIG. 6 is a flow chart of the method used to generate inputs and analysis according to the invention.

The computerized method of generating input data and of performing and storing the analysis of the data according to the invention is described by the process flow of FIG. 6. The software loop 610 provides the alignment reference input data, and the software loop 620 provides the bond pad input data. Loop 610 begins with three input steps:

611: Teaching reference image location;

612: Teaching reference image size; and

613: Teaching light settings.

The data collected from these three input sources are stored in file 615. After each acquisition loop, the question is asked in gate 618, whether all alignment reference images have been taught. As long as the answer is "no", another loop of data acquisition has to be performed. When the answer is "yes", the input process advances to the loop 620.

Bond pad points loop 620 begins with the input step:

621: Teaching bond point location.

The data collected from this input source are stored in file 625. After each acquisition loop, the question is asked in gate 628, whether all bond points have been taught. As long as the answer is "no", another loop of data acquisition has to be performed. When the answer is "yes", the input process advances to the analysis generator 630.

The data stored in file 615 together with the data stored in file 625 are used by the analysis generator 630 to construct the relationships between the bond pad points and the alignment reference images of the master circuit as described above. The resulting network of relations, together with all the data, is stored in master file 640 as the master bond program.

Figure 7:
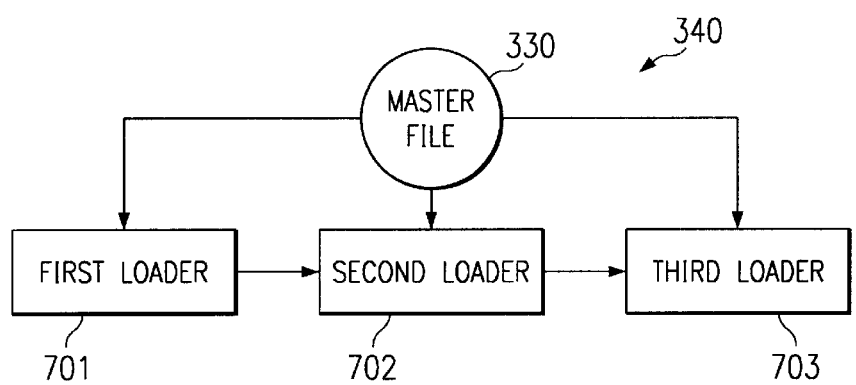
FIG. 7 illustrates a block diagram of the detail of the retriever associated with the computerized slave bonder.

FIG. 7 shows the retriever 340, associated with the slave bonder, in more detail. The first computerized loader 701, coupled to the master file 330, operates to download alignment reference x-y locations data, stored in the master file 330 as part of the stored master bond program. The second computerized loader 702, coupled to the first loader 701 as well as to the master file 330, operates to download alignment reference image data, stored in the master file 330 as part of the stored master bond program. The third computerized loader 703, coupled to the second loader 702 as well as to the master file 330, operates to download bond pad x-y locations data, stored in the master file 330 as part of the stored master bond program.

Figure 8:
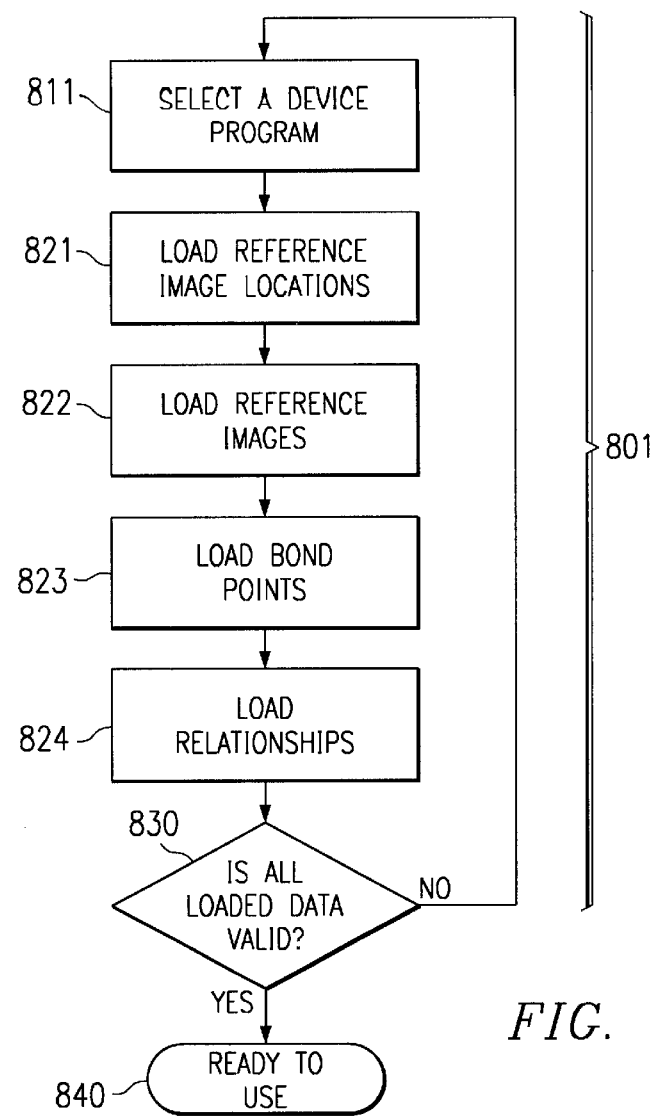
FIG. 8 is a flow chart of the method used by the retriever according to the invention.

The computerized method of retrieving data according to the invention is described by the process flow of FIG. 8. The software loop 801 provides the assurance for retrieval completeness. Loop 801 begins with the step of:

811: Selecting a bonding program. This step is followed by four retrieval steps:

821: Downloading alignment reference image locations;

822: Downloading alignment reference images;

823: Downloading bond pad points; and

824: Downloading relationships between alignment references and bond pad locations.

After each downloading loop, the question is asked in gate 830, whether all downloaded data is valid. As long as the answer is "no", another loop of data downloading has to be performed. When the answer is "yes", the retrieval process advances at step 840 to the usage/bonding process.

Figure 9:
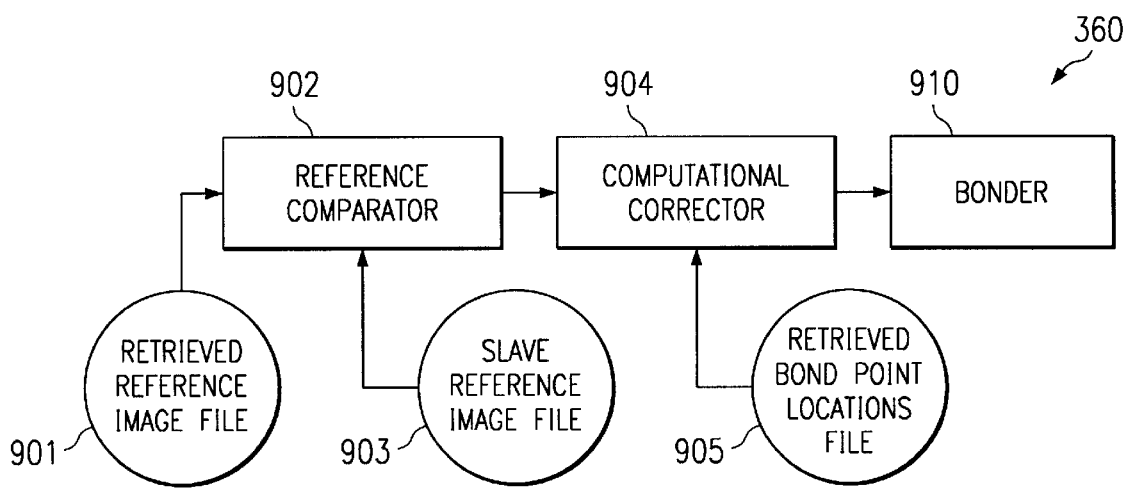
FIG. 9 illustrated a block diagram of the detail of the comparative corrector associated with the computerized slave bonder.

As shown in FIG. 9, the data retrieved onto the slave machine/bonder is used by the comparative corrector 360, which is associated with the slave bonder and coupled to the retriever 340 discussed in FIG. 7. Referring to FIG. 9, file 901 provides the reference images retrieved from the master file. File 901 is coupled to the reference comparator 902. Further coupled to reference comparator 902 is file 903 which is coupled to the second input data generator (designated 350 in FIG. 3). As stated above, the second data generator collects images from alignment references on the circuit-to-be-bonded (slave circuit). Consequently, file 903 provides alignment reference images on the slave circuit to reference comparator 902.

Reference comparator 902 operates to compare the alignment reference images stored in file 901 with the alignment images input from file 903, and to identify any deviations. Specifically, reference comparator 902 quantifies any shifts, rotations, or scalings between the two images or image parts.

The reference comparator 902 is coupled to the computational corrector 904. Further coupled to the computational corrector 904 is file 905 which provides the bond pad point locations retrieved from the master file. The computational corrector 904 uses the quantitative data comparison from the reference comparator 902 and the bond pad point locations (x-y locations) from file 905 in order to re-compute the bond pad locations on the circuit-to-be-bonded (slave circuit). The corrected coordinates (x-y locations) of the slave circuit bond pads can now be forwarded to the bonding machine (bonder) 910.

The computerized bonder 910, coupled to the computational corrector 904, operates as the slave bonder to attach the connecting bonds (wires, ribbons, balls, stitches, etc.) to the bond pads of the slave circuit under the direction of the re-computed bond pad locations (bond program) provided by the computational corrector 904.

Figure 10:
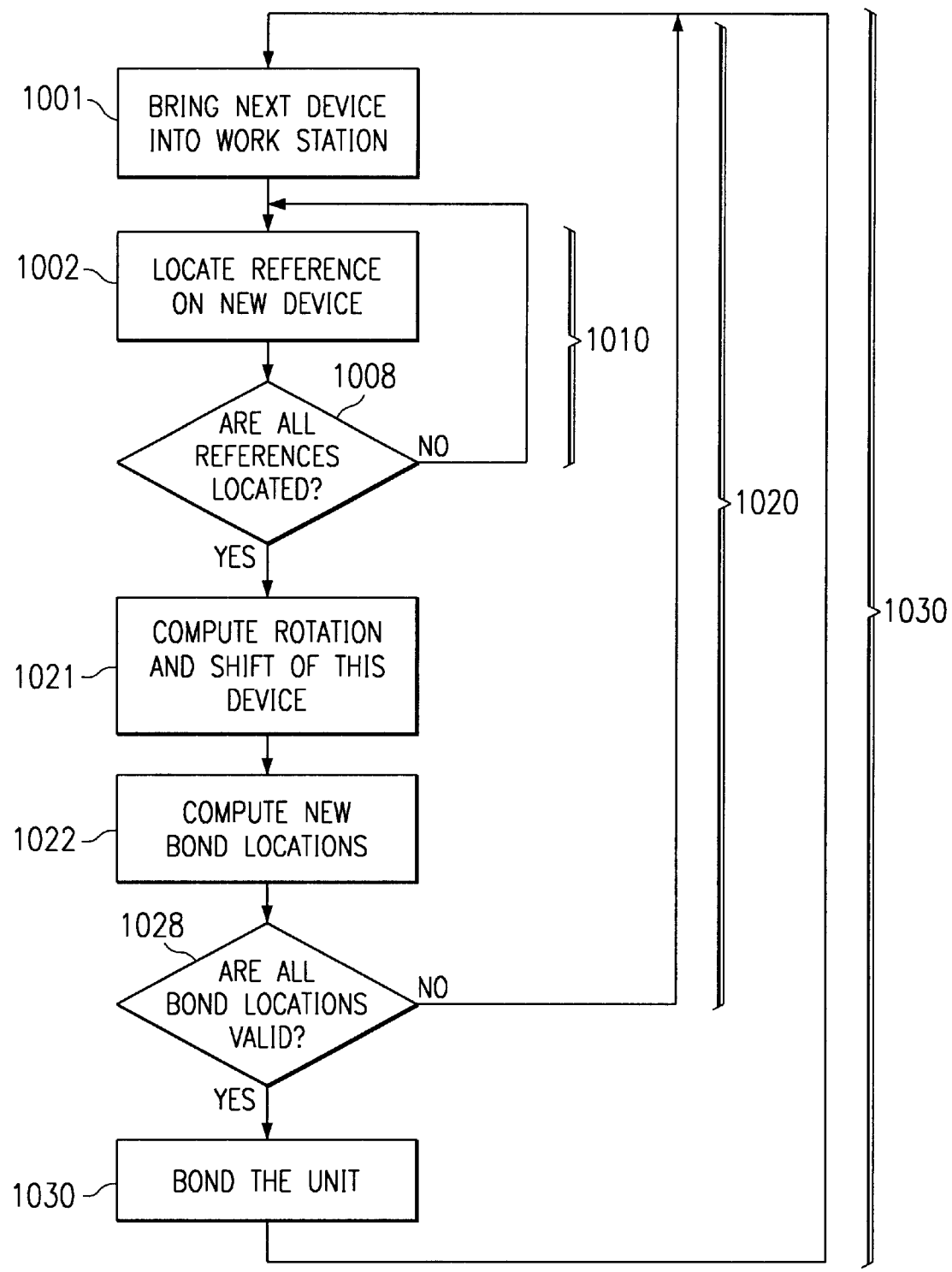
FIG. 10 is a flow chart of the method used by the comparative corrector and the slave bond head according to the invention.

The computerized method of computing, correcting, and using bond pad data according to the invention is described by the process flow of FIG. 10. The process starts with the step of:

1001: Bringing the next circuit-to-be-bonded (slave circuit) into the bonder work station (slave bonder).

1002: Locating alignment references on the slave circuit. After each identification of a reference, the question is asked in gate 1008, whether all references have been located. As long as the answer is "no", another loop 1010 of locating references has to be performed. When the answer is "yes", the process flow advances to step 1021:

1021: Computing any shifts, rotations, or scalings found on this slave circuit, as described in FIG. 9.

1022: Re-computing the correct bond pad locations on the slave circuit. After each re-computing, the question is asked in gate 1028, whether all slave circuit bond pad locations are valid. As long as the answer is "no", another loop 1020 of re-computing and correcting has to be performed. When the answer is "yes", the actual bonding process 1030 on the slave circuit can begin.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments. As an example, the computer-implemented method of the invention can be applied for reducing operational program errors in any slave machine, prepared to work on action sites of any slave object, and comprises the steps of:

generating input data, associated with a master machine, the data collected from a master object, related in geometry or history to the slave object, and comprising geometrical information of action sites and images of reference sites;

generating an analysis for constructing a network of relationships between the images of the reference sites and the geometrical information of action sites on the master object;

storing the network of relationships, the geometrical information and the images in a master file as an operational master program;

retrieving the master program for the slave machine;

generating input information, associated with the slave machine, the information collected from the slave object and comprising images of reference sites;

comparing the reference sites within the master program with the slave object reference sites; and correcting any deviation found between the sites and the x-y locations in the program, thereby re-computing the x-y locations in the operational program of the slave machine for working on the action sites of the slave object.

We claim:

1. A computerized system for reducing operational program errors in a slave machine prepared to work on action sites of a slave object, comprising:

a first input data generator, associated with a master machine, operable to collect data from a master object which is related in geometry or history to said slave object, comprising geometrical information of action sites and images of reference sites;

an analysis generator, associated with said master machine and coupled to said first input data generator, operable to construct a network of relationships for said master machine between said images of reference sites and said geometrical information of action sites on said master object;

a master file, coupled to said analysis generator, operable to store said network of relationships, said geometrical information and said images as an operational master program;

a retriever, associated with said slave machine and coupled to said master file, operable to retrieve said operational master program;

a second input data generator associated with said slave machine, operable to generate images as input information from reference sites on said slave object; and a comparative corrector associated with said slave machine, coupled to said retriever and said second input data generator, operable to compare said operational master program with said slave object reference sites, and to correct any deviation found between said sites and said program, whereby said operational program of said slave machine is re-computed for working on said action sites of said slave objects.

2. A computerized system for reducing bond program errors in a slave bonder prepared to attach connecting bonds onto bond pads of a slave integrated circuit, comprising:

a first input data generator, associated with a master bonder, operable to collect data from a master integrated circuit which is related in geometry to said slave integrated circuit, comprising geometrical information of bond pads and images of alignment references;

an analysis generator, associated with said master bonder and coupled to said first input data generator, operable to construct a network of relationships for said master bonder between said images of said alignment references and said geometrical information of said bond pads;

a master file, coupled to said analysis generator, operable to store said network of relationships, said geometrical information and said images as a master bond program;

a retriever, associated with said slave bonder and coupled to said master file, operable to retrieve said master bond program;

a second input data generator associated with said slave bonder, operable to generate images as input information from alignment references on said slave integrated circuit; and a comparative corrector associated with said slave bonder, coupled to said retriever and said second data generator, operable to compare said master bond program with said slave circuit alignment references, and to correct any deviation found between said references and said program, whereby said bond program of said slave bonder is recomputed for bonding on said bond pads of said slave circuit.

3. The system according to claim 2 wherein said first input data generator comprises:
 a first organizer operable to select alignment references, to collect the x-y locations correlated to said alignment references, and to store the x-y locations data in a reference x-y file;
 a collector, coupled to said first organizer, operable to select images of said alignment references, and to store said images in a reference image file; and
 a second organizer, coupled to said collector, operable to select bond pads, to collect x-y locations correlated to said pads, and to store said x-y locations data in a x-y locations file.

4. The system according to claim 3 wherein said input data for said first and second organizers and said collector are collected manually by an expert.

5. The system according to claim 2 wherein said bond program comprises bonding parameters for integrated circuit chip assembly.

6. The system according to claim 2 wherein said images are created by illumination, optics, and photographic cameras coupled to said computer-controlled bonders.

7. The system according to claim 2 wherein said master bonder is a computer-controlled independent bonder.

8. The system according to claim 2 wherein said slave bonder is any computer-controlled bonder.

9. The system according to claim 2 wherein said master integrated circuit is an integrated circuit used as a reference circuit.

10. The system according to claim 2 wherein said slave integrated circuit is an integrated circuit identical in type to said master integrated circuit, said slave circuit to be bonded by said slave bonder.

11. The system according to claim 2 wherein said analysis generator comprises:
 a computerized relations builder operable to select x-y locations of said bond pads and to express their mutual geometries and their relations to said alignment reference images in order to establish their interconnected network; and
 a file operable to store said interconnected network as said master bond program.

12. The system according to claim 11 wherein said interconnected network is expressed in equations comprising x-y as well as polar coordinates.

13. The system according to claim 3 wherein said retriever comprises:
 a first computerized loader, coupled to said master file, operable to download said stored alignment reference x-y locations data;
 a second computerized loader, couple to said master file and said first loader, operable to download said stored alignment reference image data; and
 a third computerized loader, coupled to said master file and said second loader, operable to download said stored bond pad x-y locations data.

14. The system according to claim 3 wherein said comparative corrector comprises:
 a reference comparator, coupled to said master file and further to said second input data generator, operable to compare said alignment reference image stored in said master file with the alignment image input from said slave circuit on said slave bonder, and to quantify shifts, rotations, and scalings between said two images or image parts;
 a computational corrector, coupled to said reference comparator and to said master file, operable to re-compute the bond pad locations on said slave circuit based on the quantitative data comparison from said comparator and said bond x-y locations data from said master file; and
 a computerized bonder, coupled to said computational corrector, operable as said slave bonder to attach connecting bonds onto the bond pads of said slave circuit directed by said re-computed bond pad locations of said computational corrector.

15. A computer-implemented method for reducing operational program errors in a slave machine prepared to work on action sites of slave objects, comprising the steps of:
 generating input data, associated with a master machine, said data collected from a master object, related in geometry or history to said slave object, and comprising geometrical information of action sites and images of reference sites;
 generating an analysis for constructing a network of relationships between said images of reference sites and said geometrical information of action sites on said master object;
 storing said network of relationships, said geometrical information and said images in a master file as an operational master program;
 retrieving said master program for said slave machine;
 generating input information, associated with said slave machine, said information collected from said slave object and comprising images of reference sites;
 comparing said reference sites within said master program with said slave object reference sites; and
 correcting any deviation found between said sites and said x-y locations in said program, thereby re-computing said x-y locations in said operational program of said slave machine for working on said action sites of said slave object.

16. A computer-implemented method for reducing bond program errors in a slave bonder prepared to attach connecting bonds onto bond pads of a slave integrated circuit, comprising the steps of:
 generating input data associated with a master bonder, said data collected from a master integrated circuit, related in geometry to said slave integrated circuit, and comprising geometrical information of bond pads and images of alignment references;
 generating an analysis for constructing a network of relationships between said images of said alignment references and said geometrical information of said bond pads on said master circuit;
 storing said network of relationships, said geometrical information and said images in a master file as a master bond program;
 retrieving said master bond program for said slave bonder;
 generating input information, associated with said slave bonder, said information collected from said slave circuit and comprising images of alignment references;
 comparing said alignment reference images within said master bond program with said slave circuit alignment reference images; and correcting any deviation found between said reference images and said program, thereby re-computing said x-y locations in said bond program of said slave bonder for bonding on said bond pads of said slave circuit.

17. The computer-implemented method according to claim 16 wherein said step of generating input data from said master circuit comprises:

selecting alignment references, collecting x-y locations correlated to said alignment references, and storing said x-y locations data in a reference x-y file;

selecting images of said alignment references and storing said images in a reference image file; and selecting bond pads, collecting x-y locations correlated to said pads, and storing said x-y locations data in a x-y locations file.

18. The computer-implemented method according to claim 16 wherein said step of generating an analysis for constructing a network of relationships comprises:

selecting x-y locations of said bond pads;

expressing the mutual geometries of said x-y locations;

expressing the relations of said x-y locations to said alignment reference images;

establishing the interconnected network between said geometries and relations comprising equations expressed in x-y as well as polar coordinates; and storing said network, said geometries and said images in a file as the master bond program.

19. The computer-implemented method according to claim 17 wherein said step of retrieving said master bond program comprises:

downloading said stored alignment reference x-y locations data;

downloading said stored alignment reference images data; and downloading said stored bond pad x-y locations data.

20. The computer-implemented method according to claim 16 wherein said step of generating input data from said slave circuit comprises:

selecting images of alignment references; and storing said images in a slave image file.

21. The computer-implemented method according to claim 16 wherein said step of comparing comprises:

comparing said alignment reference images stored in said master bond program with said alignment images stored in said slave image file; and quantifying shifts, rotations and scalings between said two images.

22. The computer-implemented method according to claim 17 wherein said step of correcting comprises:

re-computing the x-y locations of said bond pads of said slave circuit based on said x-y locations of said bond pads in said master file and any of said shifts, rotations and scalings found in said comparison; and correcting said bond program of said slave bonder, thereby preparing said slave bonder to attach connecting bonds onto said bond pads of said slave circuit.

* * * * *